United States Patent
Fu et al.

(10) Patent No.: US 8,349,724 B2
(45) Date of Patent: Jan. 8, 2013

(54) METHOD FOR IMPROVING ELECTROMIGRATION LIFETIME OF COPPER INTERCONNECTION BY EXTENDED POST ANNEAL

(75) Inventors: Xinyu Fu, Pleasanton, CA (US); Jick M. Yu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 434 days.

(21) Appl. No.: 12/635,528

(22) Filed: Dec. 10, 2009

(65) Prior Publication Data

US 2010/0167526 A1 Jul. 1, 2010

Related U.S. Application Data

(60) Provisional application No. 61/141,946, filed on Dec. 31, 2008.

(51) Int. Cl.
*H01L 21/4763* (2006.01)

(52) U.S. Cl. ........ 438/627; 438/637; 438/643; 438/653; 438/687; 257/E21.577; 257/E21.584; 257/E21.585

(58) Field of Classification Search .......... 438/627, 438/637, 643, 648, 650, 653, 656, 687; 257/E21.577, E21.584, E21.585
See application file for complete search history.

(56) References Cited

U.S. PATENT DOCUMENTS

| | | | |
|---|---|---|---|
| 6,037,257 A | 3/2000 | Chiang et al. | |
| 6,221,765 B1 * | 4/2001 | Ueno | 438/653 |
| 6,508,920 B1 | 1/2003 | Ritzdorf et al. | |
| 6,855,648 B2 | 2/2005 | Huang et al. | |
| 6,869,871 B1 * | 3/2005 | Choi | 438/622 |
| 6,979,642 B1 | 12/2005 | Buynoski et al. | |
| 7,030,016 B2 * | 4/2006 | Feng et al. | 438/687 |
| 7,192,494 B2 | 3/2007 | Chen et al. | |
| 7,993,816 B2 * | 8/2011 | Black et al. | 430/311 |
| 2002/0006719 A1 * | 1/2002 | Farrar et al. | 438/618 |
| 2004/0166017 A1 * | 8/2004 | Caron et al. | 420/492 |
| 2004/0259376 A1 * | 12/2004 | Huang et al. | 438/758 |
| 2006/0154465 A1 * | 7/2006 | Suh et al. | 438/597 |

FOREIGN PATENT DOCUMENTS

| | | |
|---|---|---|
| JP | 2003-273209 A | 9/2003 |
| KR | 2005-0046056 A | 5/2005 |

OTHER PUBLICATIONS

PCT International Search Report and Written Opinion dated Jul. 19, 2010 for International Application No. PCT/US2009/068093.

* cited by examiner

*Primary Examiner* — Zandra Smith
*Assistant Examiner* — Toniae Thomas
(74) *Attorney, Agent, or Firm* — Patterson & Sheridan, LLP

(57) ABSTRACT

Methods for improving electromigration of copper interconnection structures are provided. In one embodiment, a method of annealing a microelectronic device including forming microelectronic features on a substrate, forming a contact structure over the microelectronic features, and forming a copper interconnection structure over the contact structure. A passivation layer is deposited over the copper interconnection structure and the substrate is subjected to a first anneal at a temperature of about 350° C. to 400° C. for a time duration between about 30 minutes to about 1 hour. The substrate is subjected to a second anneal at a temperature of about 150° C. to 300° C. for a time duration between about 24 to about 400 hours.

23 Claims, 6 Drawing Sheets

METHOD FOR IMPROVING ELECTROMIGRATION LIFETIME OF COPPER INTERCONNECTION BY EXTENDED POST ANNEAL

CROSS-REFERENCE TO RELATED APPLICATIONS

This application claims benefit of U.S. provisional patent application Ser. No. 61/141,946, filed Dec. 31, 2008, which is herein incorporated by reference.

BACKGROUND OF THE INVENTION

1. Field of the Invention

Embodiments of the present invention generally relate to a method of improving microelectronic device lifetime. In particular, embodiments of the present invention generally relate to improving electromigration lifetime of copper interconnection structures.

2. Description of the Related Art

Microelectronic devices, such as semiconductors or integrated circuits (IC), can include millions of electronic circuit devices such as transistors, capacitors, etc., such as found in ultra-large scale integrated (ULSI) circuits. To further increase the density of devices found on integrated circuits, smaller and smaller feature sizes are necessary. For example, the size of conductive lines, vias, and interconnects, gates, etc. must decrease. Reliable formation of multilevel interconnection structures of ULSI technology is also necessary to increase circuit density and quality. Advances in IC fabrication techniques have enabled use of copper conductive lines, interconnects, vias, and other structures. However, with decreased feature size and the increased use of copper interconnect structures, electromigration in interconnect structures becomes a greater hurdle to overcome.

Hundreds, if not thousands of processing steps are required to form an IC. Usually the steps will include deposition, etching, rapid thermal processing (RTP), oxidation, film growth, ion implantation, chemical-mechanical polishing (CMP), photolithography, etc. to form various features in the microelectronic device. As a final processing step, sometimes the substrate is annealed at a temperature of about 350° C. to 400° C. for a time duration between about 30 minutes to about 1 hour. When forming interconnect structures by means of such processing steps, electromigration remains a large hurdle to overcome.

Electromigration is the transport of material caused by the gradual movement of the atoms in a conductor due to the momentum transfer between conducting electrons and diffusing metal atoms that can cause depletion or accumulation of metal atoms. During normal, regular use of microelectronic devices, electrons collide with metal atoms causing the atoms to gradually move. This movement may cause a depletion of atoms at the negative end of the conductor, leading to voids, thinning of lines, and a potential open circuit.

In other regions of the conductor, an accumulation of metal atoms may pile up and form hillocks, protrusions on the surface of metal films due to electromigration. If excessive or large hillocks form, adjacent lines or lines on two levels may short together.

Increased current density and chip temperature, attendant with the advanced circuitry designs in the ULSI technology, make the metallization or interconnect structure more prone to electromigration. Thus, methods of further improving electromigration in interconnect structures of microelectronic devices are needed.

SUMMARY OF THE INVENTION

Embodiments of the present invention generally provide a method of annealing a microelectronic device including forming microelectronic features on a substrate, forming a contact structure over the microelectronic features, and forming a copper interconnection structure over the contact structure. A passivation layer is deposited over the copper interconnection structure and the substrate is subjected to a first anneal at a temperature of about 350° C. to 400° C. for a time duration between about 30 minutes to about 1 hour. The substrate is subjected to a second anneal at a temperature of about 150° C. to 300° C. for a time duration between about 24 to about 400 hours.

In another embodiment of the invention, a method of annealing a copper structure on a substrate is provided. The method includes depositing a dielectric layer on a substrate, forming at least one feature in the dielectric layer, depositing copper in the at least one feature to form the copper structure, and annealing the copper structure at a temperature of about 150° C. to 300° C. for a time duration between about 24 to about 400 hours.

In another embodiment of the invention, a method for reducing electromigration of copper in microelectronic devices is provided. The method includes depositing a dielectric layer on a substrate; forming at least one copper interconnection structure in the dielectric layer; and annealing the copper interconnection structure at a temperature of about 150° C. to 300° C. for a time duration between about 24 to about 400 hours.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention relates to the reduction of electromigration degradation of interconnections in microelectronic devices. In particular, the present invention relates to an annealing process that improves electromigration lifetime of interconnections in microelectronic devices, such as integrated circuits.

The electromigration effect is important in applications where high direct current densities are used. As the feature size in microelectronic devices, such integrated circuits, decreases, the practical significance of this affect increases. Electromigration reliability is one of the most critical issues in back-end-of-line (BEOL) interconnection formation, particularly in dual damascene copper interconnections.

During BEOL processing of integrated circuit fabrication, the microelectronic device undergoes various processes to interconnect the previously formed devices on the semiconductor substrate, such as transistors, resistors, etc. The formation of microelectronic devices such as integrated circuits may employ hundreds, if not thousands, of individual process steps, such as deposition, photolithography, etching, ion implantation, oxidation, CMP, etc. to form various features in the microelectronic device. Due to the lengthy nature of reviewing each and every process step, only some of these steps will be discussed as part of the overall manufacture of microelectronic devices.

Figure 1:
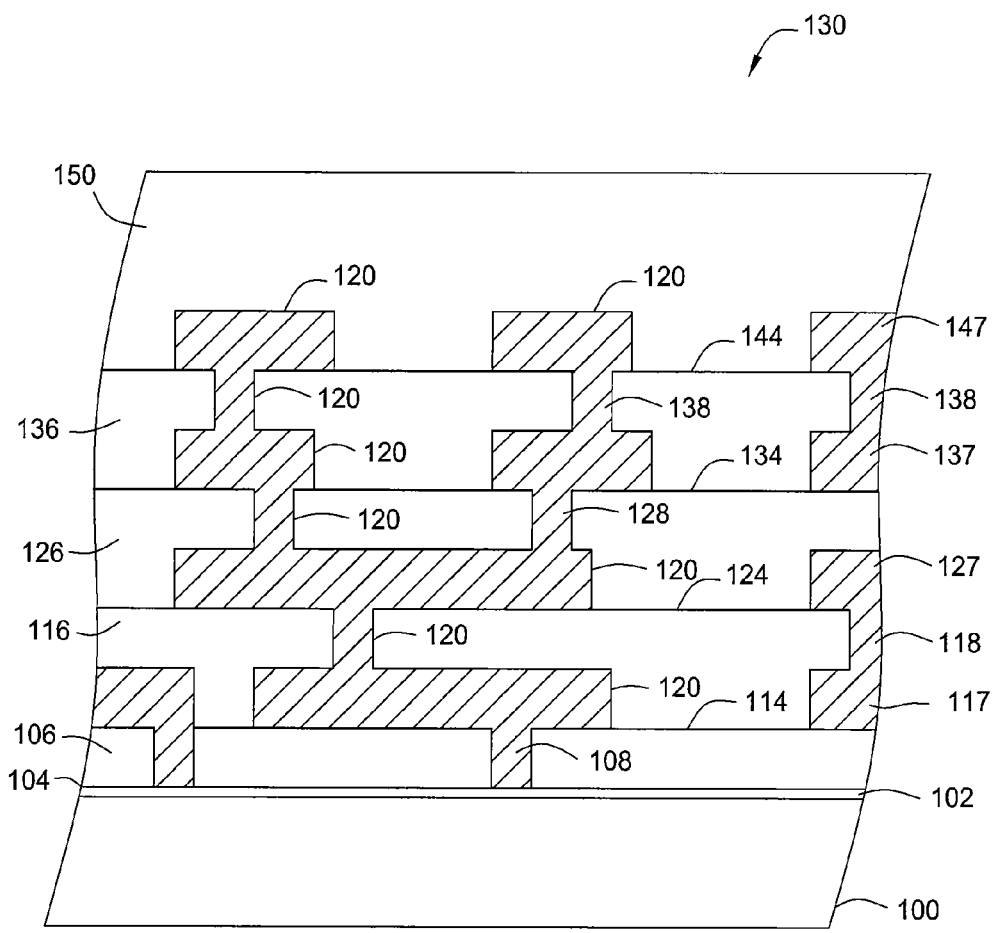
FIG. 1 is a cross-sectional view of a microelectronic device.

FIG. 1 is a cross-sectional view of a microelectronic device 130 having a multilevel interconnection structure. Various microelectronic features, for example, gates, sources/drains, metal contacts, vias, metal layers, etc., may be formed on a substrate 100 when forming microelectronic circuits such as transistors, capacitors, resistors, lines, etc. The multilevel interconnection structure is formed on a substrate 100 which may comprise various semiconductor materials for example silicon, germanium, gallium arsenide, and silicon carbide.

The interconnection structure may comprise various metallic layers formed on the substrate 100. The metallic layers may comprise copper or copper alloys. A contact structure, such as a copper layer 102, forms a conductive line on the substrate 100 that may connect various features on the substrate, such as metal contacts of various sources/drains located on the substrate 100. An etch stop layer 104, such as silicon nitride, may be formed over the copper layer 102. Inter-metal dielectric layers 106 and 116 may be formed over the copper layer 102 by various deposition techniques, such as chemical vapor deposition, physical vapor deposition, atomic layer deposition, spin on deposition, etc.

The inter-metal dielectric layers 106 and 116 may be subjected to photolithographic and etching processes to pattern the inter-metal dielectric layer 106 to form holes and trenches in which metallic vias and lines may be deposited. A commonly employed technique for forming the interconnect structure is a dual damascene process. For example, a first level metal layer may include vias 108 made from copper and formed in the inter-metal dielectric layer 106 to contact the underlying copper layer 102 with lines 117 as shown in FIG. 1.

Formation of the copper layers may be performed by first depositing a copper seed layer followed by a bulk deposition of copper, which will be further described below. Prior to depositing the lines 117 and vias 108, a barrier layer 120, such as tantalum nitride, may be deposited in the holes and trenches to line the bottoms and walls of the holes and trenches in order to prevent diffusion of copper into surrounding materials. In one embodiment, the copper interconnection structure may comprise a barrier layer between the copper or copper alloy lines and vias and the dielectric layer.

The above processes may be repeated to form multiple levels of metallic interconnections, thereby forming an interconnection structure. For example, FIG. 1 depicts four layers of metallic interconnections. The first metal interconnection layer includes vias 108 and lines 117. The second metal interconnection layer includes vias 118 and lines 127. The third metal interconnection layer includes vias 128 and lines 137. The fourth metal interconnection layer includes vias 138 and lines 147. Each metal interconnection layer is formed in the surrounding inter-metal dielectric layers 106, 116, 126, and 136. Multiple barrier layers 120 may also be formed in each metal interconnection layer, as shown in FIG. 1. Additionally, etch stop layers 124, 134, and 144 may be formed throughout the interconnection layers, as shown in FIG. 1. Depending on the type of microelectronic device being formed, the dielectric layers may comprise high or low-k dielectric materials. Chemical mechanical planarization or polishing (CMP) processes are usually employed during the interconnection structure formation to assure proper thicknesses of the various layers and features.

A passivation layer 150 is deposited on the interconnection structure as part of the final steps of microelectronic device fabrication. The passivation layer 150 protects the underlying features from moisture, scratches, and general contamination. Typically, the passivation layer 150 comprises silicon nitride. The substrate is subsequently annealed at a temperature of about 350° C. to 400° C. for a time duration between about 30 minutes to about 1 hour. The substrate is then subjected to an extended long or super anneal to improve electromigration lifetime. The super or second anneal occurs at a temperature of about 150° C. to 300° C. for a time duration between about 24 to about 400 hours. A suitable furnace or oven may be used to anneal the substrate under the super annealing conditions.

Figure 2:
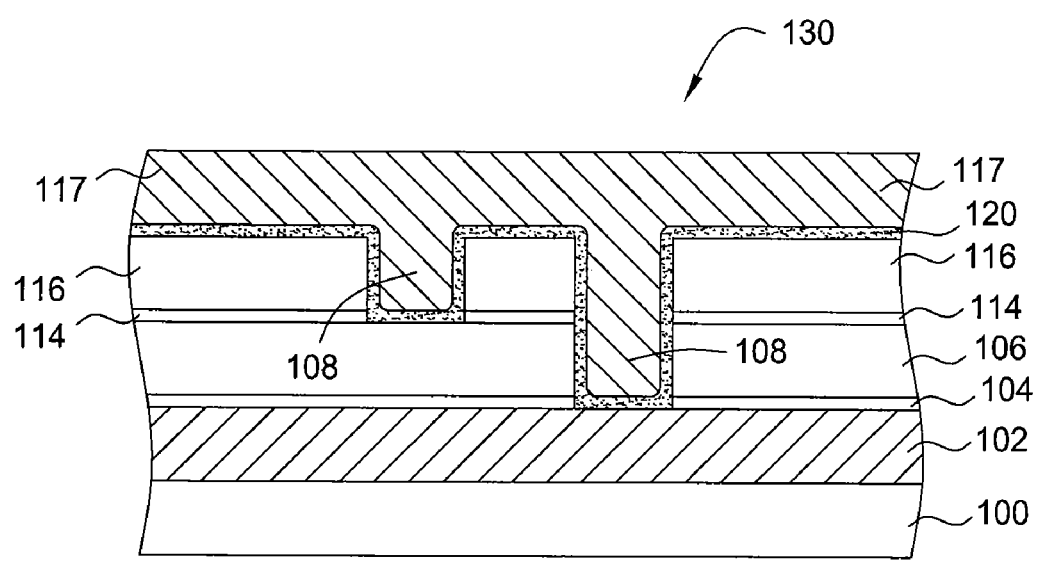
FIG. 2 is a cross-sectional another view of a microelectronic device.

FIG. 2 is an enlarged cross-sectional view of microelectronic device 130 having a copper interconnect structure of one metal interconnect layer. A copper layer 102 is formed on substrate 100. An etch stop layer 104, such as silicon nitride, is formed on the copper layer 102. Inter-metal dielectric layers 106 and 116 are deposited on substrate 100, including another etch stop layer 114 formed in between the inter-metal dielectric layers 106 and 116. After patterning the inter-metal dielectric layers 106 and 116, a barrier layer 120 is formed to line the bottom and side walls of the patterned holes and trenches formed in the inter-metal dielectric layers 106 and 116. A copper interconnect structure including a line 117 and vias 108 are formed in the inter-metal dielectric layers 106 and 116.

Figure 3:
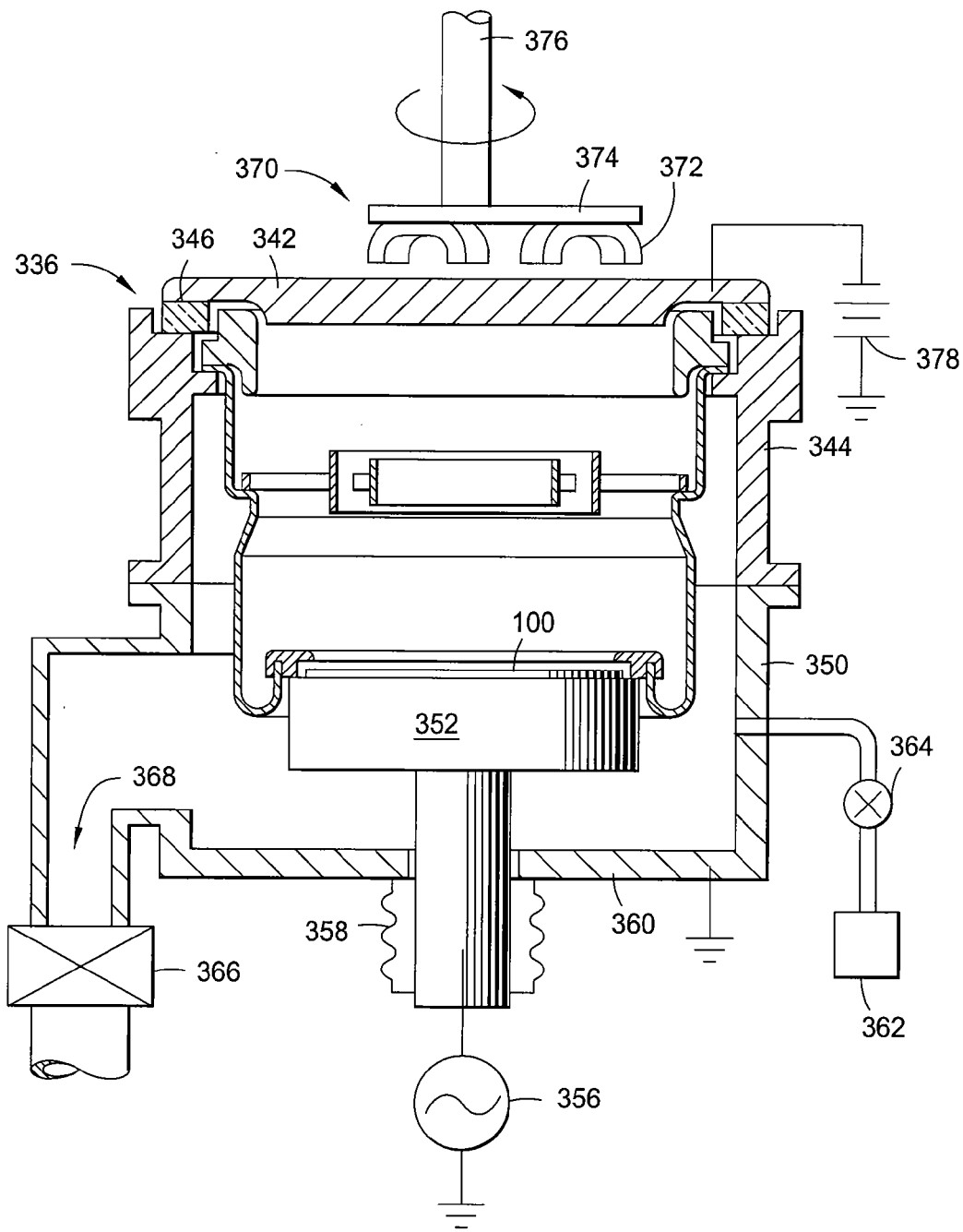
FIG. 3 is a cross-sectional view of an apparatus that may be used to form the multilevel interconnection structure.

FIG. 3 illustrates one apparatus, a PVD chamber 336, that may be used to form the interconnect structures shown in FIGS. 1 and 2. Examples of suitable PVD chambers are the EnCoRe™ processing chamber, the EnCoRe™ II processing chamber and the SIP (Self-Ionized Plasma) EnCoRe™ II Ta(N) processing chamber, each of which is commercially available from Applied Materials, Inc. of Santa Clara, Calif.

Generally, the PVD chamber 336 contains a sputtering source, such as a target 342, and a substrate support 352 for receiving a substrate 100 thereon and located within a grounded enclosure wall 350. The chamber 336 includes a target 342 supported on and sealed, as by O-rings (not shown), to a grounded conductive aluminum adapter 344 through a dielectric isolator 346. The target 342 comprises the material to be deposited on the substrate 100 surface during sputtering, and may include copper, aluminum, cobalt, titanium, tantalum, tungsten, molybdenum, platinum, nickel, iron, niobium, palladium, and combinations thereof, which may be used in an inert gas atmosphere for forming metal layers or in a reaction gas atmosphere for forming barrier layers. The target 342 may also include a bonded composite of a metallic surface layer and a backing plate of a more workable metal.

The substrate support 352 is vertically movable through a bellows 358 connected to a bottom chamber wall 360 to allow the substrate 100 to be transferred onto the substrate support 352 through a load lock valve (not shown) in the lower portion of the chamber 336 and thereafter raised to a deposition position. Processing gas is supplied from a gas source 362 through a mass flow controller 364 into the lower part of the chamber 336. Gases exit the chamber through conduit 368 with valve 366.

A controllable DC power source 378 coupled to the chamber 336 may be used to apply a negative voltage or bias to the target 342. An RF power supply 356 may be connected to the substrate support 352 in order to induce a negative DC self-bias on the substrate 100, but in other applications the substrate support 352 may be grounded or left electrically floating.

A rotatable magnetron 370 is positioned in back of the target 342 and includes a plurality of horseshoe magnets 372 supported by a base plate 374 connected to a rotation shaft 376 coincident with the central axis of the chamber 336 and the substrate 100. The magnets 372 produce a magnetic field within the chamber 336, generally parallel and close to the front face of the target 342 to trap electrons and thereby increase the local plasma density, which in turn increases the sputtering rate.

The copper interconnect structures may be formed using various methods. For example, a tantalum-nitride barrier layer may be deposited in previously formed holes and trenches in dielectric material on a substrate 100 placed within the PVD chamber 336. A punch-through process step may be performed to remove the barrier layer or any other layer from the bottom of a hole or trench, so that after the trench or hole is filled with bulk copper, the copper via or line will directly contact any underlying copper line or via as desired. Next, the PVD chamber may be used to only deposit a copper seed layer in the holes and trenches. As an alternative, the PVD chamber may deposit a copper seed layer, etch away a portion of the deposited copper seed layer, and flash deposit more copper seed layer in the holes and trenches, which is sometimes referred to as a RF copper seed deposition-etch-flash process.

Once the copper seed layer has been deposited in the holes and trenches, a bulk copper layer is deposited to fill the holes and trenches with copper or copper alloy. Various methods have been employed to deposit bulk copper layers to form vias and lines, such as chemical vapor deposition (CVD) processes or electro-chemical plating (ECP) processes. A CMP process may then be used to assure proper thicknesses of the various layers and features within each layer. As each copper interconnect layer is formed and connected to layers both above and below, the final copper interconnection structure of the microelectronic device is created.

Figure 4:
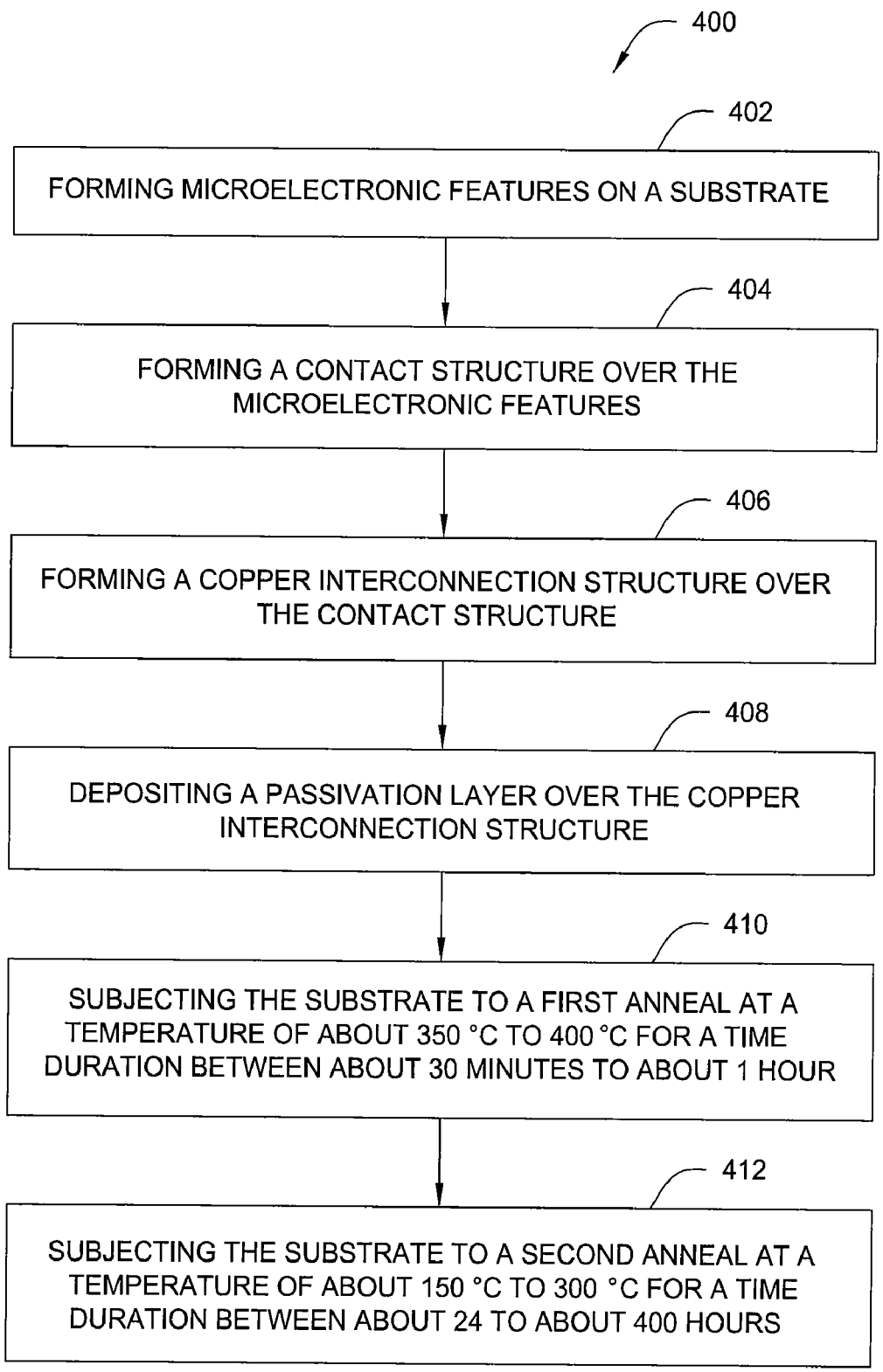
FIG. 4 is a process diagram of one embodiment of the invention.

To enhance microelectronic device lifetime and reliability, an extended long or super annealing procedure may be performed on the substrate. In FIG. 4, a process diagram of one embodiment of a method 400 of annealing a microelectronic device is illustrated. The method includes forming microelectronic features on a substrate, box 402, and forming a contact structure over the microelectronic features, box 404. Examples of various contact structures, such as copper layer 102, are shown in FIGS. 1 and 2.

A copper interconnection structure is formed over the contact structure as shown in box 406. Various types of copper interconnection structures, such as dual damascene structures, lines, and vias, are illustrated in FIGS. 1 and 2. In one embodiment, the copper interconnection structure may include multiple metal layers or lines 117, 127, 137, 147 and vias 108, 118, 128, 138 as shown in FIGS. 1 and 2. Additionally, the copper interconnect structure is located in dielectric material, such as various dielectric layers 106, 116, 126, 136, as shown in FIGS. 1 and 2. In some embodiments, the copper interconnection structure comprises a barrier layer 120, such as tantalum, tungsten, cobalt, nickel, hafnium, niobium, zirconium, ruthenium, and alloys, nitrides, silicides, and combinations thereof. The barrier layer 120 may also comprise copper silicide.

A passivation layer is deposited over the copper interconnection structure, box 408, and the substrate is subjected to a first anneal at a temperature of about 350° C. to 400° C. for a time duration between about 30 minutes to about 1 hour, box 410. The first anneal may take place as part of the final anneal step used to manufacture microelectronic devices. In the present invention, the substrate is then subjected to a second or super anneal at a temperature of about 150° C. to 300° C. for a time duration between about 24 to about 400 hours, box 412. In one embodiment, the annealing temperature is performed at 250° C. and is between 100 and 400 hours.

It is believed that by performing such a super annealing process on the substrate, any stress development in the confined dual damascene structure is minimized thereby reducing stress gradients and electromigration within the copper interconnection structure. This is particularly the case for increasingly smaller device features, such as feature size of 65 nm or less, which size is increasingly common in high circuit density microelectronic devices. In one embodiment of the invention, the microelectronic features, the contact structure, and the copper interconnection structure have a feature size less than 65 nm. Furthermore, it is believed that by performing the super-anneal process, any impurities in the bulk copper lines are diffused to the surface or interface of the copper so that the electromigration along those paths may also be suppressed.

Figure 5:
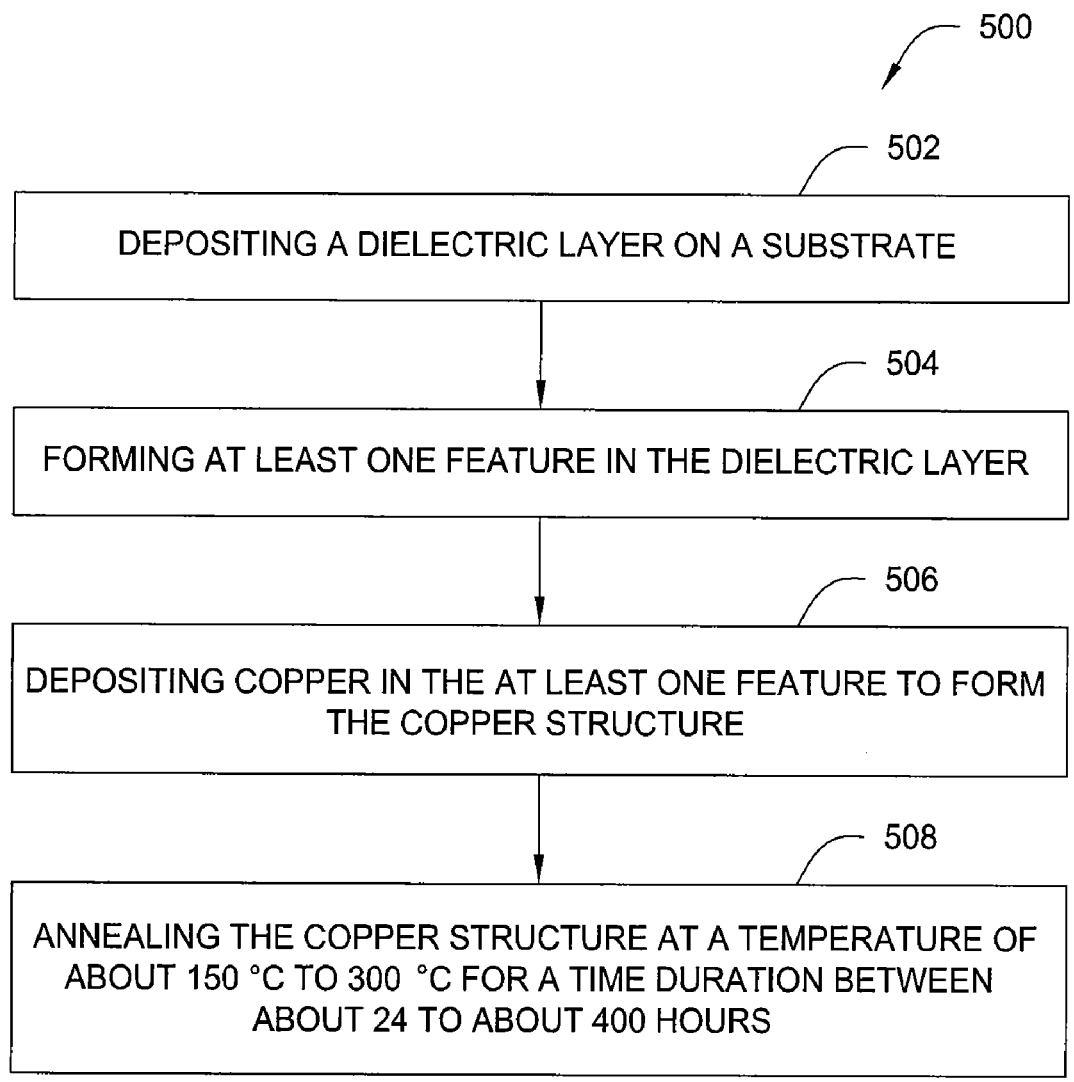
FIG. 5 is a process diagram of another embodiment of the invention.

In another embodiment of the invention, the super anneal step may occur before complete formation of a copper interconnect structure, as shown in the process diagram of FIG. 5. A method 500 of annealing a copper structure on a substrate is illustrated. The method 500 includes depositing a dielectric layer on a substrate, box 502, forming at least one feature in the dielectric layer, box 504, and depositing copper in the at least one feature to form the copper structure, box 506. A super anneal is then performed by annealing the copper structure at a temperature around 250° C. and for a time duration between about 24 to about 400 hours, box 508, such as between 100-400 hours. As previously described and shown in FIGS. 1 and 2, a feature, such as a hole or trench, may be formed in a dielectric layer on the substrate followed by depositing copper in the feature to form a copper structure. The copper structure, such as shown in FIG. 2, may then be super annealed at around 150° C. to 300° C. and for a time duration between about 24 to about 400 hours, such as between 100-400 hours. In one embodiment, the annealing temperature is performed at 250° C. Continued formation of a copper structure may occur by repeating the processes found in boxes 502, 504, 506, and 508.

Figure 6:
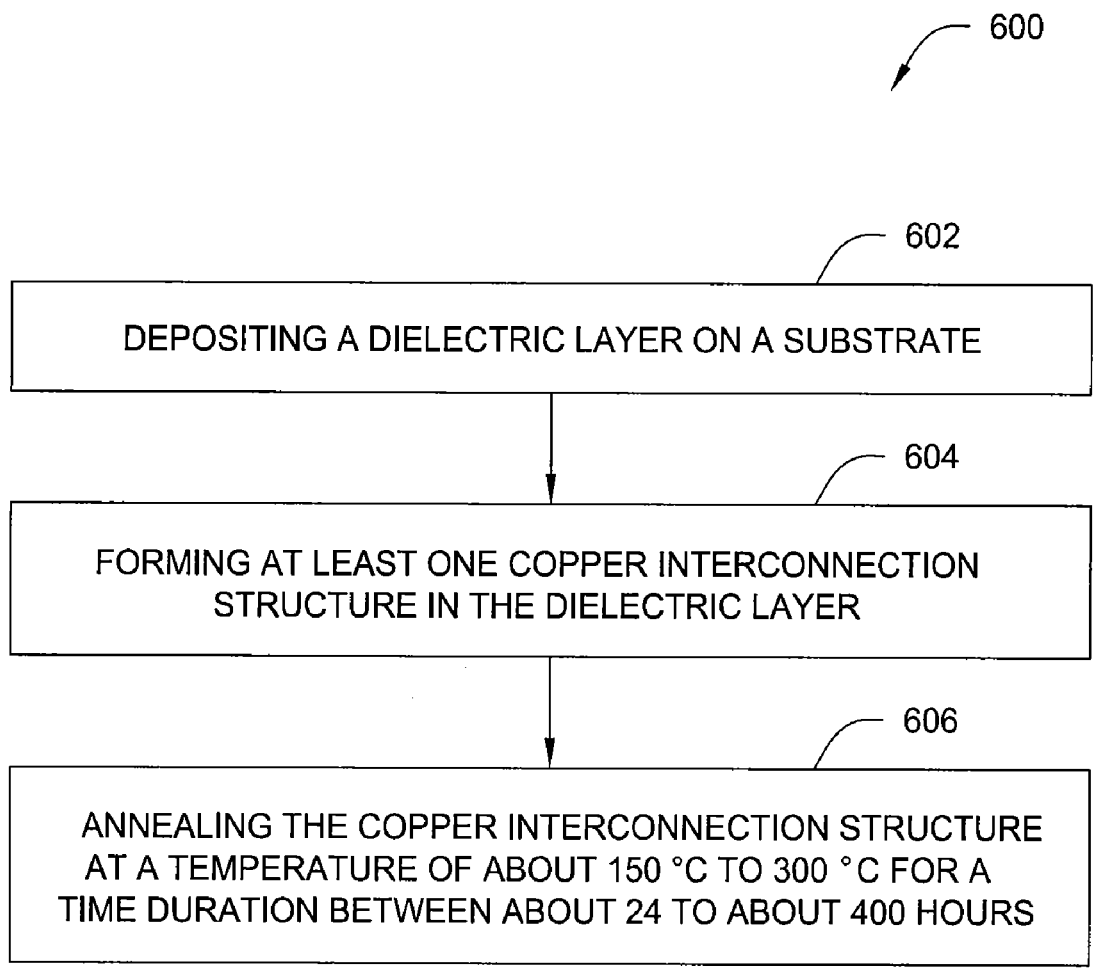
FIG. 6 is a process diagram of another embodiment of the invention.

In another embodiment of the invention, only one anneal process, the super anneal, may be used to reduce electromigration of copper as shown in the process diagram of FIG. 6. A method 600 for reducing electromigration of copper in microelectronic devices is shown. The method includes depositing a dielectric layer on a substrate, box 602, forming at least one copper interconnection structure in the dielectric layer, box 604, and annealing the copper interconnection structure at a temperature around 150° C. to 300° C. and for a time duration between about 24 to about 400 hours, box 606. In one embodiment, the time duration may be between 100-400 hours. The annealing steps of any of the embodiments may be performed in any suitable furnace or other annealing apparatus that can perform an extended long anneal according to embodiments of the invention.

By using embodiments of the invention, the electromigration lifetime of microelectronic devices has improved significantly. Tests have been carried out to evaluate the effect embodiments of the invention have on device reliability. By using Maydan Technology Center Group (MTCG) 65 nm e-test structures available from Applied Materials, Inc. of Santa Clara, Calif., the electromigration life of a microelectronic device is five times longer when the test structure is annealed using embodiments of the present invention compared to test structures formed with other annealing procedures.

Example 1

In particular, microelectronic devices were formed according to the methods disclosed above. The copper interconnect structure was formed in an EnCoRe™ II processing chamber available from Applied Materials, Inc. using a barrier layer punch through process followed by a copper seed deposition process on a MTCG 65 nm e-test structure. Subsequently, the MTCG 65 nm e-test structures were subjected to an anneal at 250° C. for 168 to 336 hours.

The MTCG 65 nm e-test structures were subjected to an electromigration test by passing 1 milliAmp (mA) of current through the device in a 300° C. environment until device failure. The electromigration lifetime of the super annealed test structures (300 hours) was five times as long when compared to e-test structures not subjected to the super anneal (60 hours). Via resistances of the wafers appear to show that the longer electromigration lifetime is not due to a larger via size.

Example 2

In another experiment, the copper interconnection was formed in an EnCoRe™ II processing chamber using a barrier layer punch through process followed by an RF copper deposition/etch/flash seed process on a MTCG 65 nm e-test structure. Subsequently, the MTCG e-test structures were subjected to an anneal at 250° C. for 168 to 336 hours. The MTCG 65 nm e-test structures were again subjected to an electromigration test by passing 1 mA of current through the device in a 300° C. environment until device failure. In this experiment, the electromigration lifetime of the super annealed test structures (600 hours) was still five times as long when compared to e-test structures not subjected to the super anneal (120 hours).

Example 3

In another experiment, the copper interconnection was formed in an EnCoRe™ II processing chamber by an RF copper deposition/etch/flash seed process on a MTCG 65 nm e-test structure, but without the barrier layer punch through process. Subsequently, the MTCG e-test structures were subjected to an anneal at 250° C. for 168 to 336 hours. The MTCG 65 nm e-test structures were again subjected to an electromigration test with increased amperage by passing 1.5 mA of current through the device in a 300° C. environment until device failure. The electromigration lifetime of the super annealed test structures without the barrier layer punch through (180 hours) was three times as long when compared to e-test structures not subjected to the super anneal (60 hours).

The driving forces of electromigration can be described in two major categories: the electron wind force and stress gradient, such as back stress and interfacial/structural stress due to thermal expansion in confined dual-damascene dielectrics of mismatched thermal coefficient. Failure analysis also appears to reveal that in many cases the accumulated voiding driven by the electromigration of copper atoms is bounded by a delaminated interface of a barrier layer and copper, such as a tantalum-copper interface, and/or the top surface of each metal layer. As feature size continues to shrink, the impact of interfacial mass transport becomes increasingly significant.

Electromigration reliability issues in dual damascene copper interconnections may be dominated by mass transport phenomena due to the presence of extended defects within copper, such as grain boundaries and interfaces. Meanwhile, the global property of electromigration threshold in dual damascene structures may be affected by back stress development.

Moreover, the force from the electromigration may induce a compressive stress which will be reinforced by the intrinsic tensile stress of the copper and may become large enough to exceed the threshold to activate electromigration. A decrease in the yield stress of copper may allow strain energy to be dissipated in the copper. This may be attributed to a kinetic balance between increasing diffusivity and decreasing tensile stress with increasing temperature.

It is believed that the majority of stress migration will occur during the super anneal and, as a consequence, decouple the driving force from stress gradient and electron wind force during electromigration at elevated temperatures (e.g. about 300° C.). Such an extended long or super anneal at moderate temperature may also help to drive impurities in the bulk copper metals to the barrier interface and copper surfaces.

For copper interconnects in the deep submicron regime, interface pathways might become the dominant paths because there are fewer grain boundary pathways along the interconnect structure and because interface or surface pathways inherently possess lower atomic energy. Impurities may help to prevent copper atom flux from fast diffusing along the copper-barrier layer interface, thus eliminating void formation during electromigration. As a result, impurities may increase the resistance to surface/interface electromigration. Then the failure mechanism for electromigration may become two large reservoirs at both ends of a single line, resulting in continuous flow that enables a very long lifetime.

While the foregoing is directed to embodiments of the present invention, other and further embodiments of the invention may be devised without departing from the basic scope thereof, and the scope thereof is determined by the claims that follow.

The invention claimed is:

1. A method of annealing a microelectronic device, the method comprising:
   forming microelectronic features on a substrate;
   forming a contact structure over the microelectronic features;
   forming a copper interconnection structure over the contact structure;
   depositing a passivation layer over the copper interconnection structure;
   subjecting the substrate to a first anneal at a temperature of about 350 to 400° C. for a time duration between about 30 minutes to about 1 hour; and subjecting the substrate to a second anneal at a temperature of about 150 to 300° C. for a time duration between about 24 to about 400 hours.

2. The method of claim 1, wherein the copper interconnection structure comprises a barrier layer formed between copper and a dielectric material.

3. The method of claim 2, wherein the barrier layer comprises tantalum, tungsten, cobalt, nickel, hafnium, niobium, zirconium, ruthenium, and alloys, nitrides, silicides, and combinations thereof.

4. The method of claim 2, wherein the barrier layer comprises copper silicide.

5. The method of claim 1, wherein the copper interconnection structure comprises a copper alloy.

6. The method of claim 1, wherein the copper interconnection structure comprises lines and vias.

7. The method of claim 1, wherein the microelectronic features, the contact structure, and the copper interconnection structure have a feature size less than 65 nm.

8. The method of claim 1, wherein the copper interconnection structure comprises multiple metal layers formed on the substrate.

9. The method of claim 1, wherein the second anneal is performed at a temperature of about 250° C.

10. A method of annealing a copper structure on a substrate, the method comprising:
   depositing a dielectric layer on a substrate;
   forming at least one feature in the dielectric layer;
   depositing copper in the at least one feature to form the copper structure; and
   annealing the copper structure at a temperature of about 150° C. to 300° C. for a time duration between about 168 to about 336 hours.

11. The method of claim 10, wherein the copper structure comprises a barrier layer between the copper and the dielectric layer.

12. The method of claim 10, further comprising:
   annealing the copper structure at a temperature of about 350 to 400° C. for a time duration between about 30 minutes to about 1 hour before the annealing the copper structure at a temperature of about 150° C. to 300° C. for a time duration between about 168 to about 336 hours.

13. The method of claim 11, wherein the barrier layer comprises copper silicide.

14. The method of claim 10, wherein the copper structure comprises a copper alloy.

15. The method of claim 10, wherein the annealing the copper structure is performed at a temperature of about 250° C.

16. A method for reducing electromigration of copper in microelectronic devices, the method comprising:
   depositing a dielectric layer on a substrate;
   forming at least one copper interconnection structure in the dielectric layer; and
   annealing the copper interconnection structure at a temperature of about 150° C. to 300° C. for a time duration between about 168 to about 336 hours.

17. The method of claim 16, wherein the copper interconnection structure comprises a barrier layer between copper and the dielectric layer.

18. The method of claim 16, further comprising:
   annealing the copper interconnection structure at a temperature of about 350 to 400° C. for a time duration between about 30 minutes to about 1 hour before the annealing the copper interconnection structure at a temperature of about 150° C. to 300° C. for a time duration between about 168 to about 336 hours.

19. The method of claim 17, wherein the barrier layer comprises copper silicide.

20. The method of claim 16, wherein the copper interconnection structure comprises lines and vias.

21. The method of claim 16, wherein the copper interconnection structure comprises multiple metal layers formed on the substrate.

22. The method of claim 16, wherein the copper interconnection structure comprises copper alloy.

23. The method of claim 16, wherein annealing the copper interconnection structure is performed at a temperature of about 250° C.

* * * * *